(12) United States Patent
Chiang et al.

(10) Patent No.: US 9,468,114 B2
(45) Date of Patent: Oct. 11, 2016

(54) HOUSING AND ELECTRONIC DEVICE USING THE SAME

(71) Applicant: FIH (Hong Kong) Limited, Kowloon (HK)

(72) Inventors: Chwan-Hwa Chiang, New Taipei (TW); Chieh-Hsiang Wang, New Taipei (TW)

(73) Assignee: FIH (Hong Kong) Limited, Kowloon (HK)

( * ) Notice: Subject to any disclaimer, the term of this patent is extended or adjusted under 35 U.S.C. 154(b) by 478 days.

(21) Appl. No.: 13/938,346

(22) Filed: Jul. 10, 2013

(65) Prior Publication Data

US 2014/0295115 A1  Oct. 2, 2014

(30) Foreign Application Priority Data

Mar. 29, 2013 (CN) .......................... 2013 1 01079868

(51) Int. Cl.
*H05K 5/02* (2006.01)
*H05K 5/04* (2006.01)
*H04M 1/02* (2006.01)

(52) U.S. Cl.
CPC ......... *H05K 5/0243* (2013.01); *H04M 1/0283* (2013.01); *H05K 5/04* (2013.01); *Y10T 428/13* (2015.01); *Y10T 428/1317* (2015.01); *Y10T 428/1355* (2015.01)

(58) Field of Classification Search
CPC ... H04M 1/0283; H05K 5/02; H05K 5/0243; Y10T 428/13; Y10T 428/1317; Y10T 428/1355; C04B 41/522
USPC ...................................... 428/34.1, 34.6, 35.8
See application file for complete search history.

(56) References Cited

U.S. PATENT DOCUMENTS

2006/0188735 A1 * 8/2006 Reising .................. C09D 5/032
428/458

\* cited by examiner

*Primary Examiner* — Yan Lan
(74) *Attorney, Agent, or Firm* — Zhigang Ma

(57) ABSTRACT

A housing includes a substrate and a decorative layer deposited on the substrate. The decorative layer includes chromium, iron, aluminum, chromium oxide, ferric oxide, and aluminum oxide. The chromium oxide, ferric oxide, and aluminum oxide distribute evenly among the chromium, iron, and aluminum respectively, such that the chromium, iron, and aluminum atoms are separated from each other. The decorative layer is electrically non-conductive and electromagnetically transmissive and gives the housing a mirror-like black and metallic appearance. An electronic device using the housing is also described.

8 Claims, 7 Drawing Sheets

HOUSING AND ELECTRONIC DEVICE USING THE SAME

BACKGROUND

1. Technical Field

The present disclosure relates to a housing and an electronic device using the housing.

2. Description of Related Art

Housings of electronic devices may be decorated by vacuum deposited metallic coatings. However, the metallic coatings are usually electrically conductive, which are prone to block electromagnetic waves, thus adversely affecting signals for the electronic devices.

Therefore, there is room for improvement within the art.

BRIEF DESCRIPTION OF THE DRAWING

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
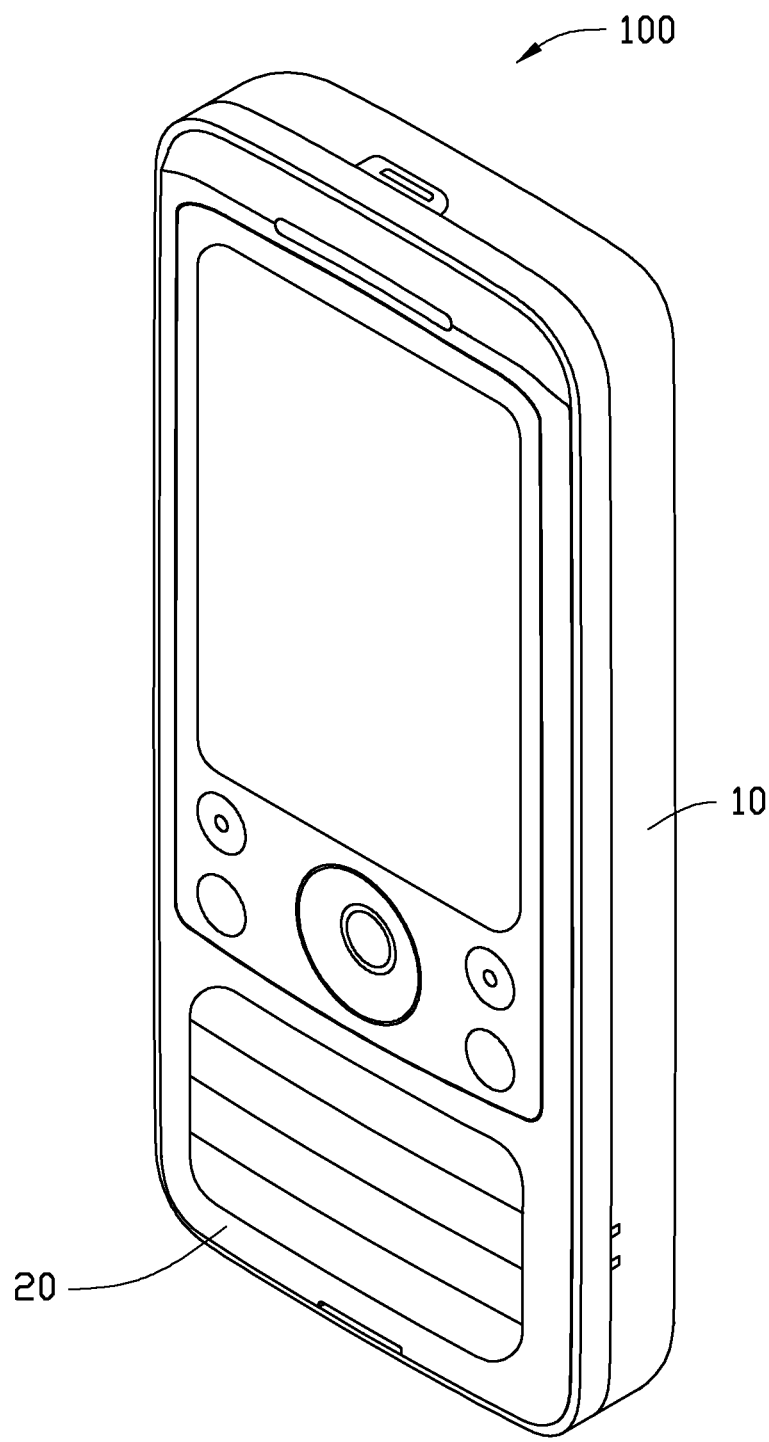
FIG. 1 is a schematic view of an electronic device.

FIG. 1 shows an electronic device 100 according to an exemplary embodiment. The electronic device 100 may be a mobile phone, a PDA, or a notebook computer, for example. The exemplary embodiment uses a mobile phone as an example to describe the electronic device 100.

The electronic device 100 includes a housing 10 and a main body 20. The housing 10 is assembled with the main body 20. Electrical elements and a displaying assembly (not shown) are received in the main body 20.

Figure 2:
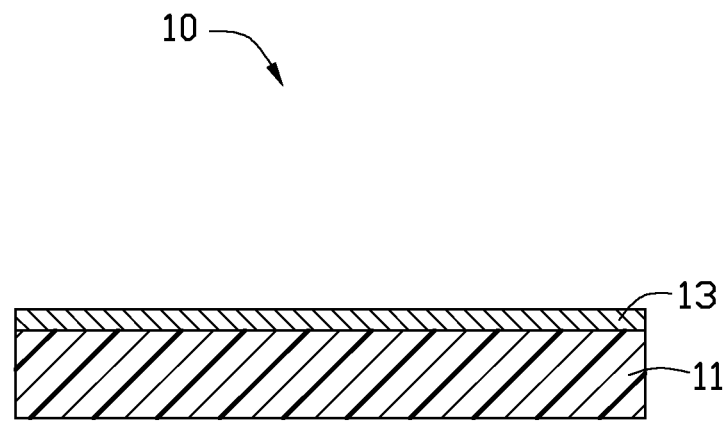
FIG. 2 is a partial cross-sectional view of a housing in accordance with a first exemplary embodiment.

Referring to FIG. 2, in a first exemplary embodiment, the housing 10 includes a substrate 11 and a decorative layer 13 formed on the substrate 11.

The substrate 11 can be made of plastic, glass, ceramic, or metal.

The decorative layer 13 contains metal elements chromium, iron, and aluminum, as well as metal oxides chromium oxide, ferric oxide, and aluminum oxide. In the decorative layer 13, the chromium has a total mass percentage between about 19% and about 20%, the iron has a total mass percentage between about 68% and about 71%, the aluminum has a total mass percentage between about 4% and about 5%, and the oxygen has a total mass percentage between about 4% and about 5%. The chromium oxide, ferric oxide, and aluminum oxide evenly distribute among the chromium, iron, and aluminum atoms respectively, such that atoms of chromium, iron, or aluminum cannot contact each other in the decorative layer 13. Therefore, the decorative layer 13 is electrically non-conductive and electromagnetically transmissive and will not block electromagnetic waves or adversely affect signals for the electronic device 100.

The decorative layer 13 has a thickness between about 30 nm and about 100 nm. In the International Commission on Illumination (CIE) LAB color system, the color value of the decorative layer 13 has an L* coordinate between about 53 and about 57, an a* coordinate between about −0.5 and about 1, and a b* coordinate between about −0.8 and about 1. Therefore, the decorative layer 13 gives the housing 10 a mirror-like black and metallic appearance.

In the decorative layer 13, when the chromium has a mass percentage of about 20%, the iron has a mass percentage of about 71%, the aluminum has a mass percentage of about 5%, the oxygen has a mass percentage of about 4%, and the decorative layer 13 has a thickness of about 30 nm, the color value of the decorative layer 13 has an L* coordinate of 55.3, an a* coordinate of −0.2, and a b* coordinate of 0.6. When the chromium has a mass percentage of about 19%, the iron has a mass percentage of about 71%, the aluminum has a mass percentage of about 5%, the oxygen has a mass percentage of about 5%, and the decorative layer 13 has a thickness of about 50 nm, the color value of the decorative layer 13 has an L* coordinate of 54.2, an a* coordinate of −0.1, and a b* coordinate of −0.3. When the chromium has a mass percentage of about 20%, the iron has a mass percentage of about 70%, the aluminum has a mass percentage of about 5%, the oxygen has a mass percentage of about 5%, and the decorative layer 13 has a thickness of about 70 nm, the color value of the decorative layer 13 has an L* coordinate of 56.2, an a* coordinate of 0.3, and a b* coordinate of 0.4. When the chromium has a mass percentage of about 20%, the iron has a mass percentage of about 71%, the aluminum has a mass percentage of about 4%, the oxygen has a mass percentage of about 5%, and the decorative layer 13 has a thickness of about 100 nm, the color value of the decorative layer 13 has an L* coordinate of 55.8, an a* coordinate of 0.5, and a b* coordinate of 0.6.

The ratio of the elements and their corresponding oxides is not limited to the ones previously described, but can be changed to influence the glossiness of the decorative layer 13.

Figure 3:
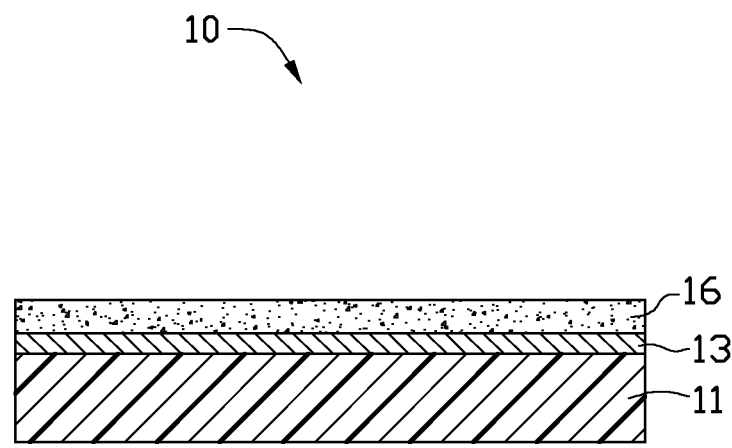
FIG. 3 is a partial cross-sectional view of a housing in accordance with a second exemplary embodiment.

Referring to FIG. 3, in a second exemplary embodiment, a top paint layer 16 is applied to the decorative layer 13. The top paint layer 16 is transparent and has a thickness between about 10 μm and about 30 μm. The top paint layer 16 enhances the mirror-like appearance of the housing 10. The top paint layer 16 is made of ultraviolet curing paint.

Figure 4:
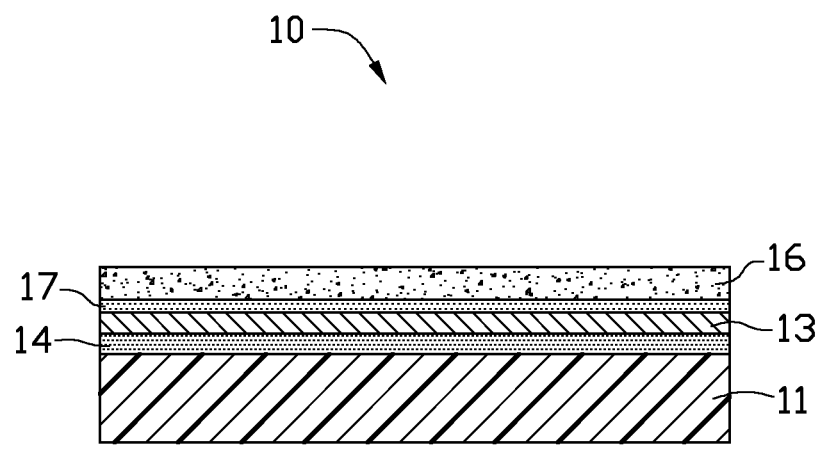
FIG. 4 is a partial cross-sectional view of a housing in accordance with a third exemplary embodiment.

Referring to FIG. 4, in a third exemplary embodiment, a middle paint layer 17 is formed between the top paint layer 16 and the decorative layer 13. The middle paint layer 17 has a thickness between about 3 μm and about 15 μm. The middle paint layer 17 makes the top paint layer 16 bond to the decorative layer 13 more securely. The middle paint layer 17 is made of either ultraviolet curing paint or thermal curing paint.

Figure 5:
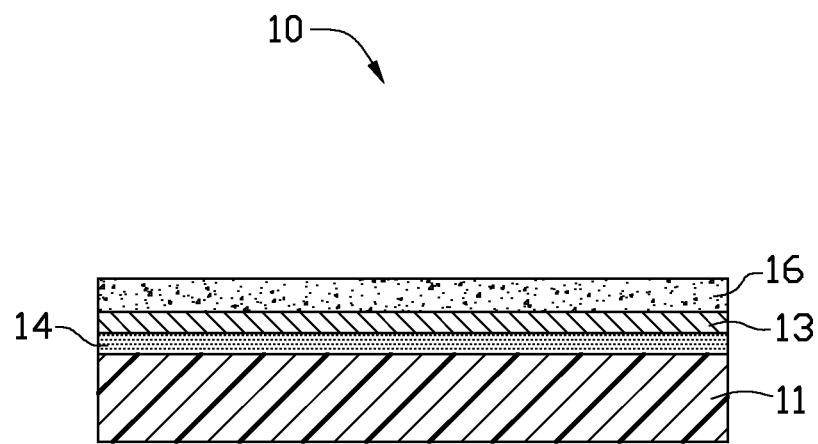
FIG. 5 is a partial cross-sectional view of a housing in accordance with a fourth exemplary embodiment.

Referring to FIG. 5, in a fourth exemplary embodiment, a first base paint layer 14 is formed between the substrate 11 and the decorative layer 13. The first base paint layer 14 has a thickness between about 5 μm and about 15 μm. The base paint layer 14 enhances the smoothness of the decorative layer 13. The first base paint layer 14 is made of ultraviolet curing paint.

Figure 6:
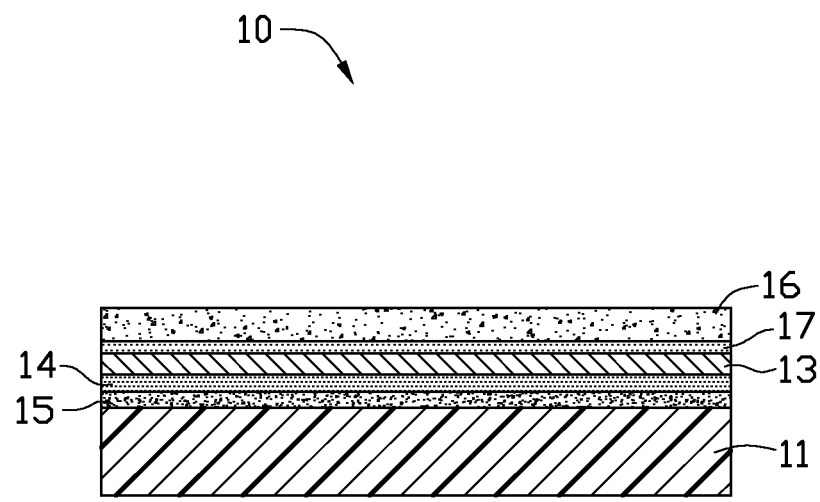
FIG. 6 is a partial cross-sectional view of a housing in accordance with a fifth exemplary embodiment.

Referring to FIG. 6, in a fifth exemplary embodiment, a second base paint layer 15 is formed between the substrate 11 and the first base paint layer 14 to enhance the bond of the first base paint layer 14 to the substrate 11. The second base paint layer 15 has a thickness between about 1 μm and about 15 μm. The second base paint layer 15 is made of ultraviolet curing paint or thermal curing paint.

Therefore, the glossiness and smoothness of the decorative layer 13 can be changed by either changing the composition of the decorative layer 13, adding the layers 14 and 16 to the decorative layer 13, or a combination of the two.

Pencil hardness tests were performed on the housings 10 of the first to fifth exemplary embodiments and the substrate 11. The tests indicated that the substrate 11 had a pencil hardness between about 1 B and about 4 B, while the housings 10 had a pencil hardness between about 1 H and about 3 H, which is far greater than the pencil hardness of the substrate 11.

Electrical conductivity tests were performed on the housings 10 using an AVO meter (not shown). The tests indicated that the housings 10 are electrically non-conductive.

Surface glossiness tests were performed on the housings 10 using a colorimeter (not shown). The tests indicated that the housings 10 according to the SCI (Specular Component Included) LAB color system have an L* coordinate between about 57 and about 59, an a* coordinate between about −1.10 and about −1.50, and a b* coordinate between about 2.50 and about 4.00. In the SCE (Specular Component Excluded) LAB color system, the color value of the housings 10 have an L* coordinate between about 0.05 and about 0.20, an a* coordinate between about 0.00 and about 0.10, and a b* coordinate between about 0.00 and about 0.15. This indicates that the housings 10 have a high glossiness and a strong mirror-like appearance.

The housing 10 of the fifth exemplary embodiment is used as an example to show how the housing 10 is formed.

The second base paint layer 15 is formed on the substrate 11 by spraying ultraviolet curing paint. After spraying, the ultraviolet curing paint is first baked at an internal oven temperature of between about 50° C. to about 90° C. for about 3 to about 10 min, then cured by ultraviolet light having an energy between about 500 MJ to about 1500 MJ for about 3 to about 10 seconds.

The first base paint layer 14 is formed on the second base paint layer 15. The method for forming the first base paint layer 14 is the same as the method for forming the second base paint layer 15.

Figure 7:
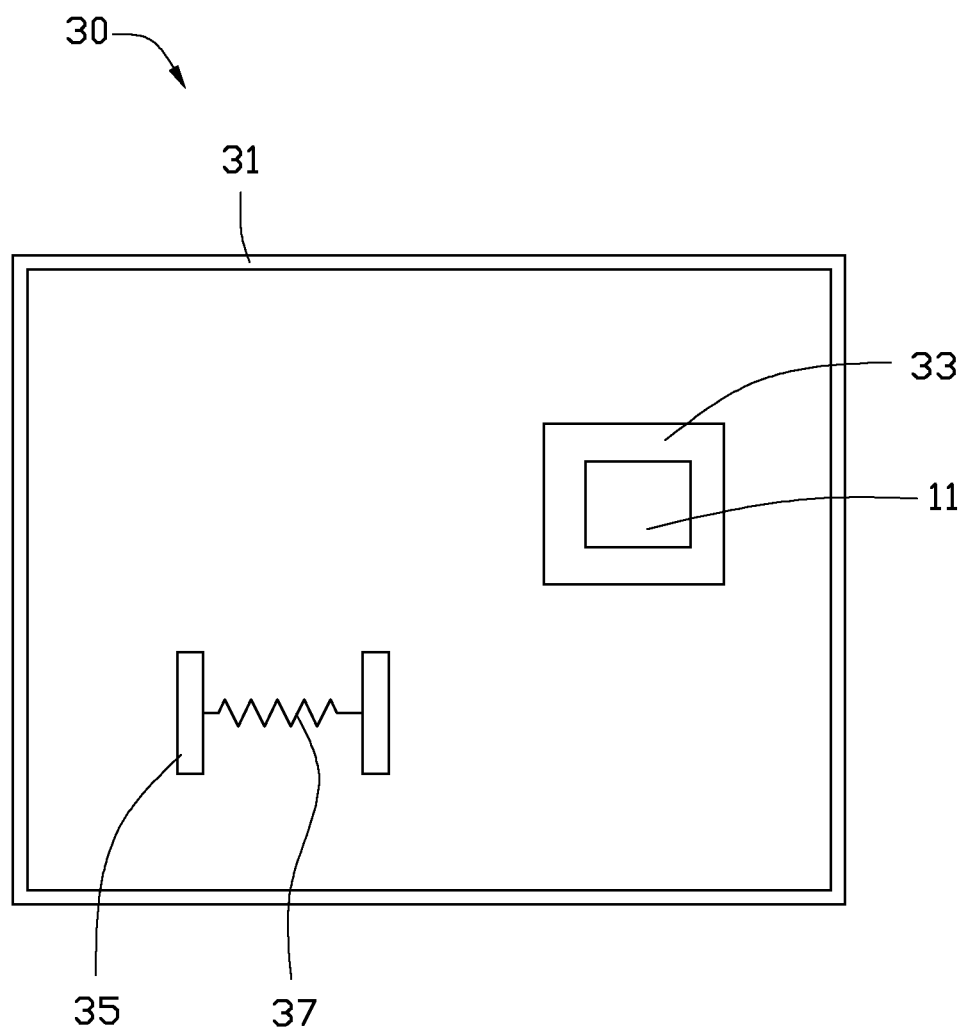
FIG. 7 is a schematic view of a vacuum depositing device.

The decorative layer 13 is formed on the first base paint layer 14. Referring to FIG. 7, an alloy wire 37 is provided. The alloy wire 37 contains metal elements of chromium, iron, and aluminum, and metal oxides of chromium oxide, ferric oxide, and aluminum oxide. In the alloy wire 37, the chromium has a total mass percentage between about 15% and about 20%, the iron has a total mass percentage between about 65% and about 70%, the aluminum has a total mass percentage between about 3% and about 8%, and the oxygen has a total mass percentage between about 2% and about 7%. The alloy wire 37 has a diameter between about 0.5 mm and about 3 mm.

Also referring to FIG. 7, a vacuum depositing device 30 is provided. The vacuum depositing device 30 includes a coating chamber 31, and a fixing element 33, two electrodes 35, and the alloy wire 37 all positioned in the coating chamber 31.

The substrate 11 is mounted onto the fixing element 33. Two ends of the alloy wire 37 are connected to the electrodes 35. A voltage of about 220 V is applied to the electrodes 35 to heat the alloy wire 37. The alloy wire 37 is then evaporated to deposit onto the first base paint layer 14 to form the decorative layer 13. Depositing the decorative layer 13 takes between about 120 seconds and about 180 seconds.

The middle paint layer 17 is formed on the decorative layer 13. The method for forming the middle paint layer 17 is the same as the method for forming the second base paint layer 15.

The top paint layer 16 is formed on the middle paint layer 17 by spraying ultraviolet curing paint. After spraying, the ultraviolet curing paint is first baked at an internal oven temperature between about 50° C. and about 90° C. for 3 to 15 min, then cured by ultraviolet light having an energy between about 1000 MJ and about 2000 MJ for about 3 to about 20 seconds.

It is believed that the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiment of the disclosure.

What is claimed is:
1. An electronic device, comprising:
    a main body; and
    a housing configured to assemble with the main body, the housing comprising:
    a substrate; and
    a decorative layer disposed on the substrate;
    wherein the decorative layer comprises chromium, iron, aluminum, chromium oxide, ferric oxide, and aluminum oxide; the chromium oxide, ferric oxide, and aluminum oxide distribute among the chromium, iron, and aluminum respectively to separate the atoms of chromium, iron, and aluminum from each other in the decorative layer; and
    wherein in the decorative layer, the chromium has a total mass percentage of about 19% to about 20%, the iron has a total mass percentage of about 68% to about 71%, the aluminum has a total mass percentage of about 4% to about 5%, and oxygen has a total mass percentage of about 4% to about 5%.
2. The electronic device as claimed in claim 1, wherein the decorative layer has a thickness of about 30 nm to about 100 nm.
3. The electronic device as claimed in claim 2, wherein the color value of the decorative layer has an L* coordinate between 53 and 57, an a* coordinate between -0.5 and 1, and a b* coordinate between -0.8 and 1 in the CIE LAB color system.
4. The electronic device as claimed in claim 1, further comprising a top paint layer formed on the decorative layer, the top paint layer is transparent, and has a thickness of about 10 μm to about 30 μm.
5. The electronic device as claimed in claim 4, further comprising a middle paint layer formed between the top paint layer and the decorative layer, the middle paint layer has a thickness of about 3 μm to about 15 μm.
6. The electronic device as claimed in claim 5, further comprising a first base paint layer formed between the substrate and the decorative layer, the first base paint layer has a thickness of about 5 μm to about 15 μm.
7. The electronic device as claimed in claim 6, further comprising a second base paint layer formed between the substrate and the first base paint layer, the second base paint layer has a thickness of about 1 μm to about 15 μm.

8. The electronic device as claimed in claim 1, wherein the substrate is made of a material selected from the group consisting of plastic, glass, ceramic, and metal.

* * * * *